United States Patent [19]

Marcel et al.

[11] 3,935,569
[45] Jan. 27, 1976

[54] DIGITAL CODER

[75] Inventors: Francois Marcel, Orsay; Alain Manoury, Viry-Chatillon, both of France

[73] Assignee: Compagnie Industrielle des Telecommunications cit-alcatel, France

[22] Filed: Sept. 17, 1973

[21] Appl. No.: 397,924

[30] Foreign Application Priority Data
Sept. 15, 1972  France .............................. 72.32892
Nov. 24, 1972  France .............................. 72.41976

[52] U.S. Cl. .......................................... 340/347 AD
[51] Int. Cl.² .................................... H03K 13/175
[58] Field of Search ............. 340/347 AD; 235/154; 324/99 D

[56]       References Cited
         UNITED STATES PATENTS

| | | |
|---|---|---|
| 3,072,332 | 1/1963 | Margopoulos ...................... 235/154 |
| 3,100,298 | 8/1963 | Fluhr ............................ 340/347 AD |
| 3,133,278 | 5/1964 | Millis ........................... 340/347 AD |
| 3,298,014 | 1/1967 | Stephenson .................. 340/347 AD |
| 3,382,438 | 5/1968 | Geller ...................... 340/347 AD X |
| 3,460,131 | 8/1969 | Gorbatenko et al. ........ 340/347 AD |
| 3,500,381 | 3/1970 | Conway ...................... 340/347 AD |
| 3,585,631 | 6/1971 | McCown ...................... 340/347 AD |
| 3,653,029 | 3/1972 | Kuhlmann .................... 340/347 AD |
| 3,688,221 | 8/1972 | Fruhalf .................. 340/347 AD UX |
| 3,737,894 | 6/1973 | Poretti ........................ 340/347 AD |

Primary Examiner—Charles D. Miller
Attorney, Agent, or Firm—Craig & Antonelli

[57]              ABSTRACT

The invention concerns a digital coder subject to a compression law having multiple linear segments with slopes decreasing in geometrical progression having a ratio of 1/2, in which a chain of threshold detectors in a linear progression is used a first time to determine the number of the segment, then a second time to determine the position of the level on the segment.

8 Claims, 7 Drawing Figures

DIGITAL CODER

The invention comes within the branch of digital coders expressing an electric voltage level by a certain number of binary elements each having a determined weight. It concerns a coder subject to a compression law having multiple linear segments with a slope progressing in a geometrical progression having a ratio of ½, with limits between segments progressing in a progression having a rate of 2, a level being coded by a binary sign element, a first set of binary elements defining the segment and a second set defining the position of the level on the segment. The main application provided for is the coding of quantified samples drawn off from the voice frequency current for telephonic pulse code modulation (PCM) transmissions.

To code a telephonic voltage level in a pulse code modulation (PCM) transmission, on account of the short time available, (a little less than 3.9 $\mu$s), in the case of a 30 channel pulse code modulation (PCM), there is every advantage in using a series-parallel coder, which has a more rapid operation than a coder having successive approximations, to avoid the memorizing of the analog samples.

In a known series-parallel compression law coder, a first subassembly, which provides the number of the segment, contains a first chain of threshold detectors spaced out in a geometrical progression; a second subassembly, which provides the order of the position of the level on the previously determined segment, contains a second chain of threshold detectors spaced out in an arithmetical progression.

The present invention uses a single chain of threshold detectors spaced out in arithmetical progression, which is used successively for determining the number of the segment, then the order of the position of the level on the segment, the feeding of the single chain of thresholds being adjusted adequately as a function of the segment determined in the first operation.

By way of an example having no limiting character, a total range of levels covering 0 to ±4000 mV is taken; the compression law comprises eight segments whose high terminals are: 31.25 mV, 62.50 mV, 125 mV, 250 mV, 500 mV, 1000 mV, 2000 mV, 4000 mV.

A first form of embodiment of a series-parallel compression law coder implementing the preceding principle, then a second form of embodiment, comprising a few modifications in structure with respect to the first form, which has certain advantages over the first form, will be described successively.

Figure 1:
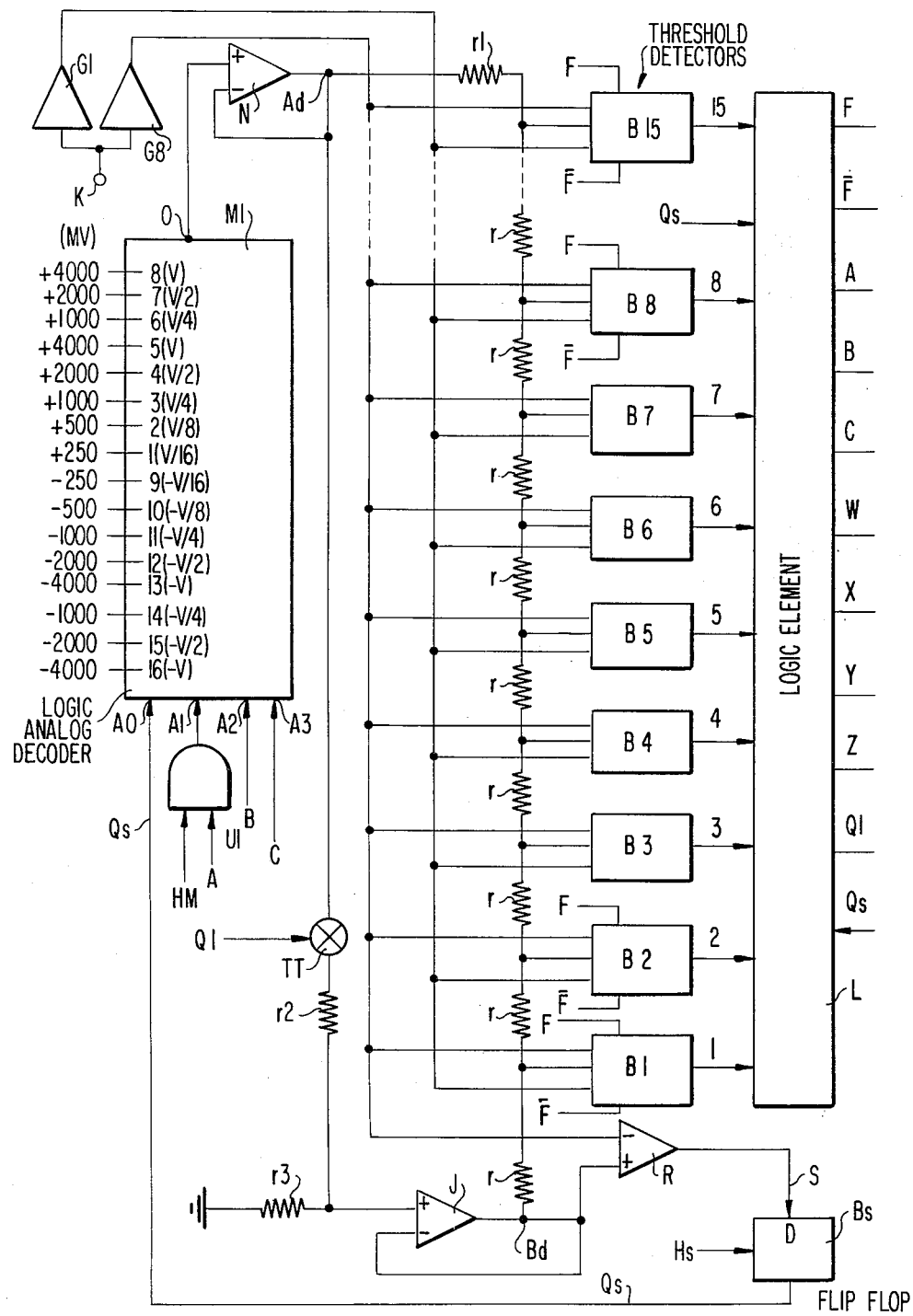
FIG. 1 shows a simplified general diagram of the first form of embodiment.
Figure 2:
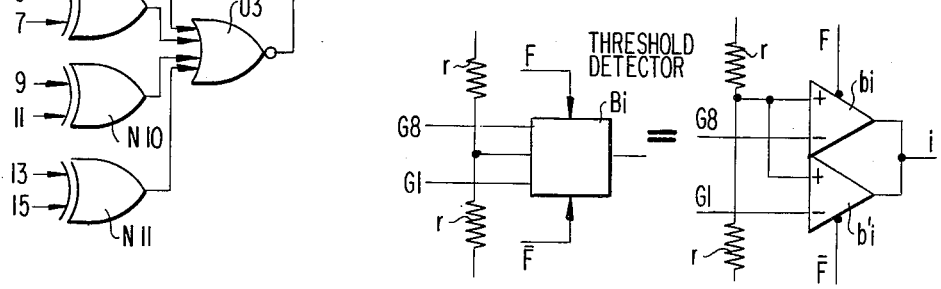
FIG. 2 shows the meaning of a symbol used in FIG. 1.

FIGS. 1 and 2 — The diagram according to FIG. 1 comprises fifteen threshold detectors B1, B2, ... B15, whose threshold values are provided by a voltage divider connected between a high point Ad and a low point Bd and comprising, downstream from a first resistor r1, fifteen equal resistors r in series, having an ohmic value of about 20 ohms.

The point Ad, receives, through an amplifier N having a gain of +1, a voltage existing at the point O of a logic analog decoder M1.

The elements B1 ... B15 receive in parallel an input signal VK existing at an input terminal K, either through an amplifier G1 having a gain of +1, or through an amplifier G8 having a gain of +8. Each supplies at the output a signal which is referenced by an order number 1, 2, ... 15.

Each of the elements Bi (FIG. 2) is constituted by two comparators bi, bi', having a + input and a — input, whose + outputs are connected in common to a point common to two adjacent resistors r, the — input of bi being connected to the output of the amplifier G8, the — input of bi' being connected to the output of the amplifier G1. The comparator bi is put into action by a logic signal F; the comparator bi' is put into action by the complementary logic signal $\overline{F}$. The outputs of the two comparators bi, bi' are connected together and provide an output signal designated by i.

The point Bd receives a voltage transmitted by an amplifier J having a gain of +1, of whose + inputs is connected to ground through a resistor r3. The resistor r3 may have a current supplied from the point Ad, through an analog gate $\pi$ and a resistor r2 in series passing through it. If the analog gate $\pi$ remains conductive, under the effect of a control signal Q1 = 0, the voltage at the point Bd is equal to half the voltage at the point Ad. If the analog gate $\pi$ is non-conductive under the effect of the signal Q1 = 1, the voltage at the point Bd is zero.

The output impedances of the amplifiers N and J are very low, less than 1 ohm.

An amplifier comparator R having two inputs, —, +, has its — input connected to the output of G8 and its + input connected to the point Bd. Its output S is connected to the terminal D of a D-type flip-flop BS which receives, moreover, a clock signal HS and supplies to the output a binary element having a sign QS.

A logic element L, which also receives QS and the outputs 1, 2, 3, ... 15, supplies the signals F and $\overline{F}$, the binary segment elements A, B, C, the binary position elements W, X, Y, Z and the control signal Q1.

The analog decoder M1 has 16 analog inputs. The inputs numbered 1 to 5 (not to be mistaken for the outputs of the elements B1 to B5), receive voltages in a geometrical progression of +V/16 to +V (for example from + 260 mV to + 4000 mV). The inputs 6 to 8 receive voltages + V/4 + V/2 + V respectively. The inputs 9 to 13 receive voltages in a geometrical progression of —V/16 to —V (— 250 mV to — 4000 mV). The inputs 14 to 16 receive voltages —V/4, —V/2, —V respectively.

The inputs 1 to 5 and 9 to 13 correspond to the five segments whose weight is the lowest (gain of 8); the inputs 6 to 8 and 14 to 16 correspond to the three segments whose weight is the highest (gain 1).

The output point 0 of the analog decoder M1 is connected to one of the sixteen inputs as a function of a code applied to the inputs A0, A1, A2, A3. A0 receives the signal QS; A1 receives the output of a gate U1, which has the signal A and a clock signal HM applied to it; A2 receives the signal B; A3 receives the signal C.

Figure 3:
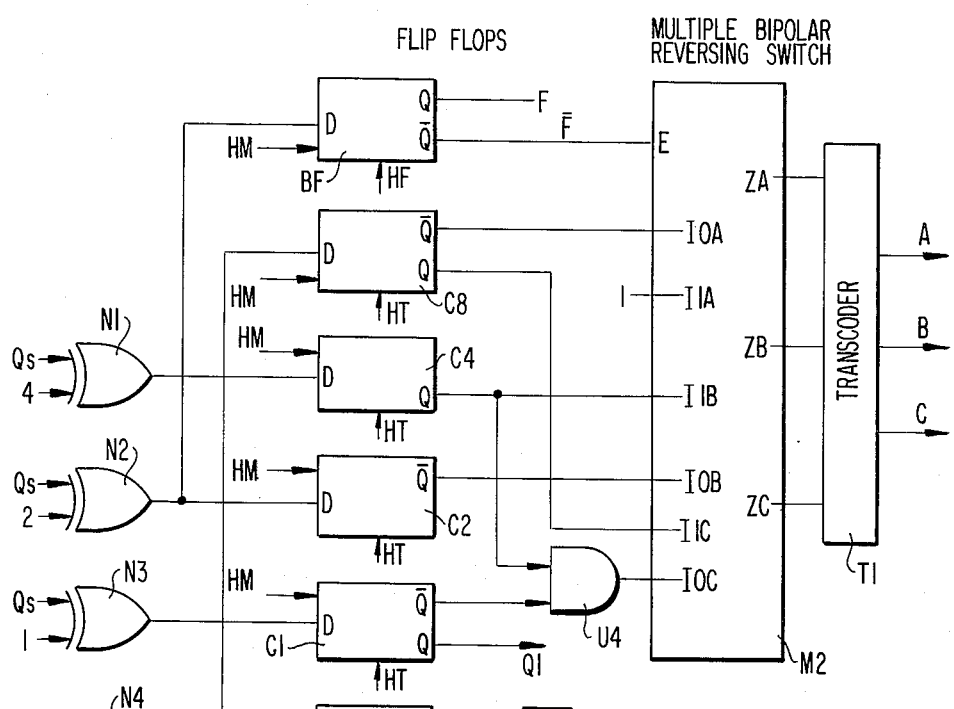
FIG. 3 shows the structure of a sub-assembly forming a part of the diagram according to FIG. 1.

FIG. 3 — The logic element L comprises the following elements;

Nine bistable type D flip-flops: BF (receiving a clock signal HF) C8, C4, C2, C1 (all four receiving a clock signal HT), P1, P2, P3, P4 (all four receiving a clock signal HQ);

Eleven EXCLUSIVE OR circuits N1 to N11 and two connected $\overline{OR}$ circuits V2, V3;

A triple bipolar reversing switch M2, whose inputs E, 10A, 11B, 10B, 11C, 10C, are connected to outputs of the first five flip-flops above, the input 11A receives a permanent logic 1 and the outputs ZA, ZB, ZC are connected to the inputs of a transcoder T1 of known type, transforming the input data from reflected binary code into natural binary code (A, B, C) defining the order of the segment. It is observed, at the inputs of the reversing switch M2, that only the threshold detectors having a geometrical progression 1, 2, 4, 8, cooperate in determining the segment (bits A, B, C).

A transcoder T2 of known type, transforming the input data (outputs of the flip-flops P1 to P4) from reflected binary code into natural binary code (W, X, Y, Z) defining the position on the said segment.

The circuits N1 to N11 have, as their inputs, the following signals:

| | | |
|---|---|---|
| N1 QS.4 | N5 4.12 | N8 1.3 |
| N2 QS.2 | N6 6.2 | N9 5.7 |
| N4 QS.1 | N7 10.14 | N10 9.11 |
| N4 QS.8 | | N11 13.15 |

The outputs of N6 and N7 are connected to the inputs of an $\overline{OR}$ circuit U2; the outputs of N8 to N11 are connected to the inputs of an $\overline{OR}$ circuit U3.

An AND gate U4 has an input connected to the terminal Q of C4 and an input connected to the terminal $\overline{Q}$ of C1.

The nine outputs are connected as follows:

| Input D | Output Q | Output $\overline{Q}$ |
|---|---|---|
| BF Output N2 | | E |
| C8 Output N4 | I 1C | 10A |
| C4 Output N1 | I 1B, U4 | |
| C2 Output N2 | | 10B |
| C1 Output N3 | Signal Q1 | U4 |
| P1 Output N4 | | T2 |
| P2 Output N5 | T2 | |
| P3 Output U2 | | T2 |
| P4 Output U3 | | T2 |

The flip-flop BF supplies the signals F and $\overline{F}$ which are shown in the diagram in FIG. 1; the flip-flop C1 supplies the signal Q1, which exists also in FIG. 1.

The clock signal HM is applied to the flip-flops BF, C2 and C8 during the resetting to zero and to the flip-flops C4 and C1 during the resetting to 1.

The switch M2 is a known element; it is a triple bipolar invertor having the following function:

| E | ZA | ZB | ZC |
|---|---|---|---|
| 0 | 10A | 10B | 10C |
| 1 | 11A | 11B | 11C |

Figure 4:
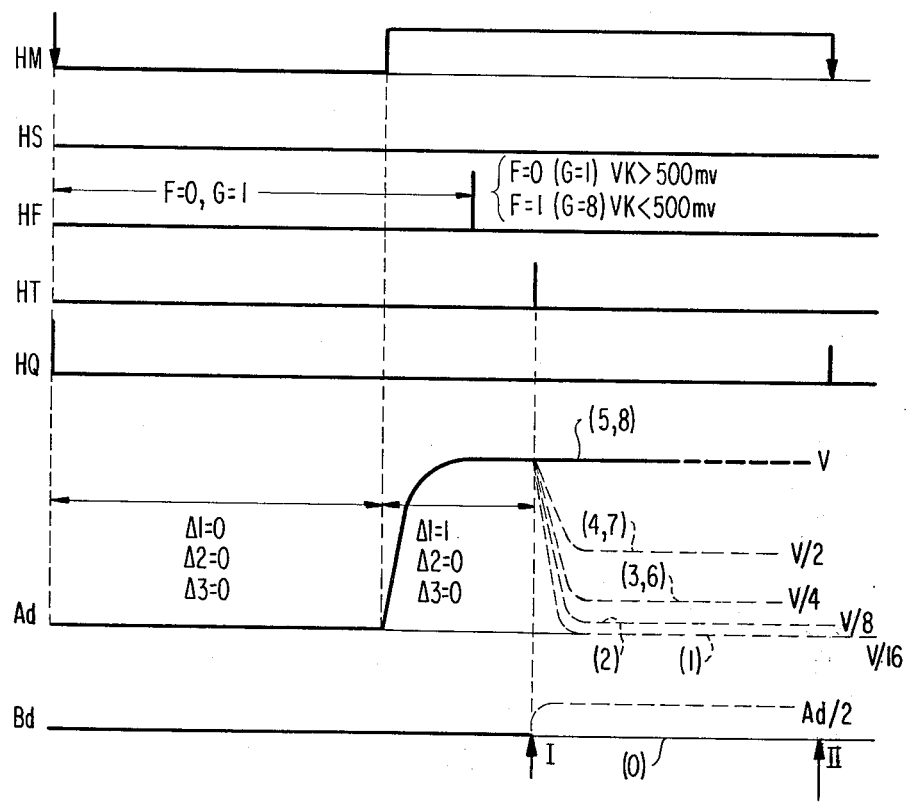
FIG. 4 is a first diagram of the time periods showing the variation of the principal logic signals and of certain parameters during a cycle for coding a voltage value according to the first form of embodiment.

FIG. 4 — FIG. 4 is a diagram of the time periods showing the clock signals HM, HS, HF, HI, HQ, as well as the values of the voltages at the points Ad and Bd during a coding cycle.

The progress of operations is as follows:

Originally, the signal HM = O sets the flip-flops C1 and C4 to 1 and the flip-flops BF, C8 and C2 to O. The result of this is A = 1, B = O, C = O, F = O. Due to the fact of the blocking of the gate U1 by HM = O, the analog decoder M1 receives A = O, B = O, C = O and its output O is at + or −V/16 (according to the sign of the sample coded in the preceding cycle). The analog gate is non-conductive, for the output Q of C1 is at 1 : Q1 = 1. The point Bd is at the potential O.

At the instant HS, the determining of the sign of the sample is effected by the flip-flop BS which records (signal QS) the state of the sign comparator R connected to the amplifier G8 having a gain of 8.

F being at 0, the gain 1 is applied to the comparators B1 to B15.

Determining the segment, the passing to 1 of the signal HM applies to the input of the analog decoder M1 the code A = 1, B = O, C = O and S = O or 1, this setting the point O to the voltage ±V according to the sign of the sample. In FIG. 4, it has been presumed that the sign of the sample is +. The point Bd is always at the potential O.

The clock signal HF causes the recording by BF of the state of the comparator B2. The state of BF (F = O) is confirmed (gain of 1 maintained) or not confirmed (the gain passes to 8).

At the instant marked I, it is possible to read by HT the flip-flops C1, C2, C4, C8 recording the state of the respective comparators B1, B2, B4, B8.

Determining the position on the segment selected: the number of the segment (code A, B, C) being applied to the inputs A1, A2, A3, respectively, of the analog decoder M1 and the flip-flop C1 defining Q1, the control signal of the gate π, (Q1 = 1 where VK < V/16, Q1 = O where VK > V/16) the points Ad and Bd will assume new potentials (if need be). These new polarizations are established as follows:

| Gain | A | B | C | Ad | Bd | No. of the segment |
|---|---|---|---|---|---|---|
| 8 | 0 | 0 | 0 | V/16 | 0 | (1) |
| | 0 | 0 | 1 | V/8 | V/16 | (2) |
| | 0 | 1 | 0 | V/4 | V/8 | (3) |
| | 0 | 1 | 1 | V/2 | V/4 | (4) |
| | 1 | 0 | 0 | V | V/2 | (5) |
| 1 | 1 | 0 | 1 | V/4 | V/8 | (6) |
| | 1 | 1 | 0 | V/2 | V/4 | (7) |
| | 1 | 1 | 1 | V | V/2 | (8) |

The number of the corresponding segment(s) have been marked in brackets for each voltage range.

After having been established in reflected binary code, the states of the fifteen comparators B1 to B15 are registered in the other flip-flops P1... P4 at the instant HQ, then converted into natural binary code by the transcoder T2 on the outputs W, X, Y, Z which are read at the instant II, end of the cycle.

To illustrate the operation of the device, the tables herebelow, corresponding to three particular cases, have been drawn up.

1. VK = +100 mV

| HS | HF | HT | HQ |
|---|---|---|---|
| QS = 1 | G = 8 | A = 0 | W = 0 |
| Ad = 4000 mV | | B = 0  Ad = 250 mV | X = 1 |
| Bd = 0 | | C = 0  Bd = 0 | Y = 1 |

-continued

| 1. VK = +100 mV | | | |
|---|---|---|---|
| HS | HF | HT | HQ |
| Q1 = 1 | | Q1 = 1 | Z = 0 |

| 2. VK = +400 mV | | | |
|---|---|---|---|
| HZ | HF | HT | HQ |
| QS = 1 | G = 8 | A = 0 | |
| Ad = 4000 mV | | B = 0  Ad = 500 mV | W = 1 |
| Bd = 0 | | C = 1  Bd = 250 mV | X = 0 |
| Q1 = 1 | | Q1 = 0 | Y = 0 |
| | | | Z = 1 |

| 3. VK = +900 mV | | | |
|---|---|---|---|
| HS | HF | HT | HQ |
| QS = 1 | G = 1 | A = 1 | W = 0 |
| Ad = 4000 mV | | B = 0  Ad = 1000 mV | X = 0 |
| Bd = 0 | | C = 1  Bd = 500 mV | Y = 1 |
| Q1 = 1 | | Q1 = 0 | Z = 1 |

The use of a single chain of comparators operating on thresholds having an arithmetical ratio, in which, in a first phase, use is made exclusively of the thresholds and comparators in geometrical progression (1, 2, 4, 8), combined with the fixing of the potential of the low point of the voltage divider (Bd), either at zero potential or at half the potential of the high point (Ad), leads to a general diagram having evident simplicity.

Furthermore, the slight interval of time which separates HT from HQ (in the order of a microsecond) does away with the necessity of memorizing the sampled analog level: indeed, during such a short period, the input level varies always by a very much smaller quantity than a quantification level.

It is stated for reference that the time, for which the coder has available an input level in a multiplex transmission system of the PCM type, comprising a frame of 32 channels, with sampling at every 125 microseconds, is in the order of 3,9 µs. To allow the reference voltages the time to be established, the first part of the coding cycle, which is about 40 percent, is a waiting period. Coding is effected during the second part (about 60 percent) of the cycle, covered by a gating pulse HM. The various clock instants are the following:

HS : coincides with the beginning of the gating pulse HM; determining of the sign of the sample;

HF : determines the choice of the input amplifier, G = 1 where Vk > 500 mV, G = 8 where VK < 500 mV;

HT : determining of the bits A, B, C;

HQ : reading of the data W, X, Y, Z, coincides with the end of the gating pulse HM.

In the various phases of the coding according to a first embodiment of the invention, such as have been set forth for reference above, the interval HF - HT is an idle time required by the fact that, on the first five segments of lower levels, it is necessary to pass from the gain 1 to the gain 8 at the input of the coder. That operation puts into action the sampling inputs of the comparators, which react strongly on the differential inputs of these latter. The reference voltages of the resistance scale r1 between the point Ad and the point Bd are therefore disturbed and the reading of the number of the segment (A, B, C) can be effected only after the disappearance of that disturbance.

To reduce the time devoted to coding, a variant adopted in a second form of embodiment consists in setting the gain flip-flop (BF) originally to the logic value 1, that is, to the gain 8. In that case, the disturbance mentioned hereinabove will occur only for the coding of the last three segments of highest weight. Whereas there are 16 steps in 250 mV for the first and second segment, there are 16 steps in 500 mV for the 6th segment: the disturbance therefore has less influence for the segments 6, 7 and 8 and the interval HF - HT may be reduced.

Figure 5:
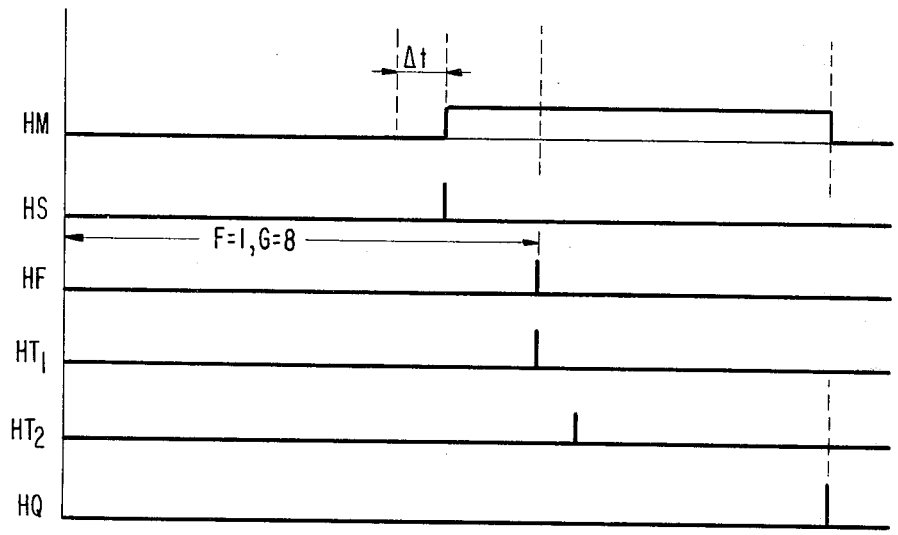
FIG. 5 is a second diagram of the time periods according to the operation in a second form of embodiment.

FIG. 5 — In FIG. 5, the gating pulse HM, shortened by a value $\Delta t$ in relation to FIG. 4, covers only half the coding cycle, instead of 60 percent.

HT is replaced by two instants, $HT_1$, $HT_2$ : $HT_1$ reading of the number of the segment, from no.1 to no.5 ; $HT_2$ subsequent - reading of the number of the segment, from no.6 to no.8.

Due to the fact that the device operates originally at the gain of 8, it is possible to register the code of the first five segments by $HT_1$ immediately after HS, since no analog operation is necessary. In that case, the interval HF — $HT_1$ is cancelled, $HT_1$ coincides with HF.

For the last three segments having a high weight (6, 7, 8), it is necessary to operate the change in gain, as previously. In that case, the time separating the reading of the position on the segment (HQ) will be reduced by the interval $HT_1$ - $HT_2$. This is possible, for the relative precision required from the voltage of the point Ad in relation to the supply voltage V (4000 mV) is lower in the case of the segments 6 to 8 than in the case of the segments 1 to 5. Therefore, the acquisition time of the point Ad may be small.

This method of operation, which shortens the effective duration of the coding, has yet another advantage.

As the device does not have an analog memory for the input level to be coded, that level varies during coding: the result of this is a distortion of the coded level, or, again, a deterioration of the signal-to-noise ratio, for the level is not the same at the instant (HT, FIG. 1a) when the number of the segment is determined and the instant (HQ) when the position on the segment is read. That variation of the input signal between these two instants which is a function of the instantaneous slope of the curve of the input signal is, of course, greater for the high levels than for the low levels. By reducing the interval $HT_2$ - HQ (FIG. 1b) in relation to the interval HT - HQ (FIG. 1a), the signal-to-noise ratio on the high levels is improved.

Figure 6:
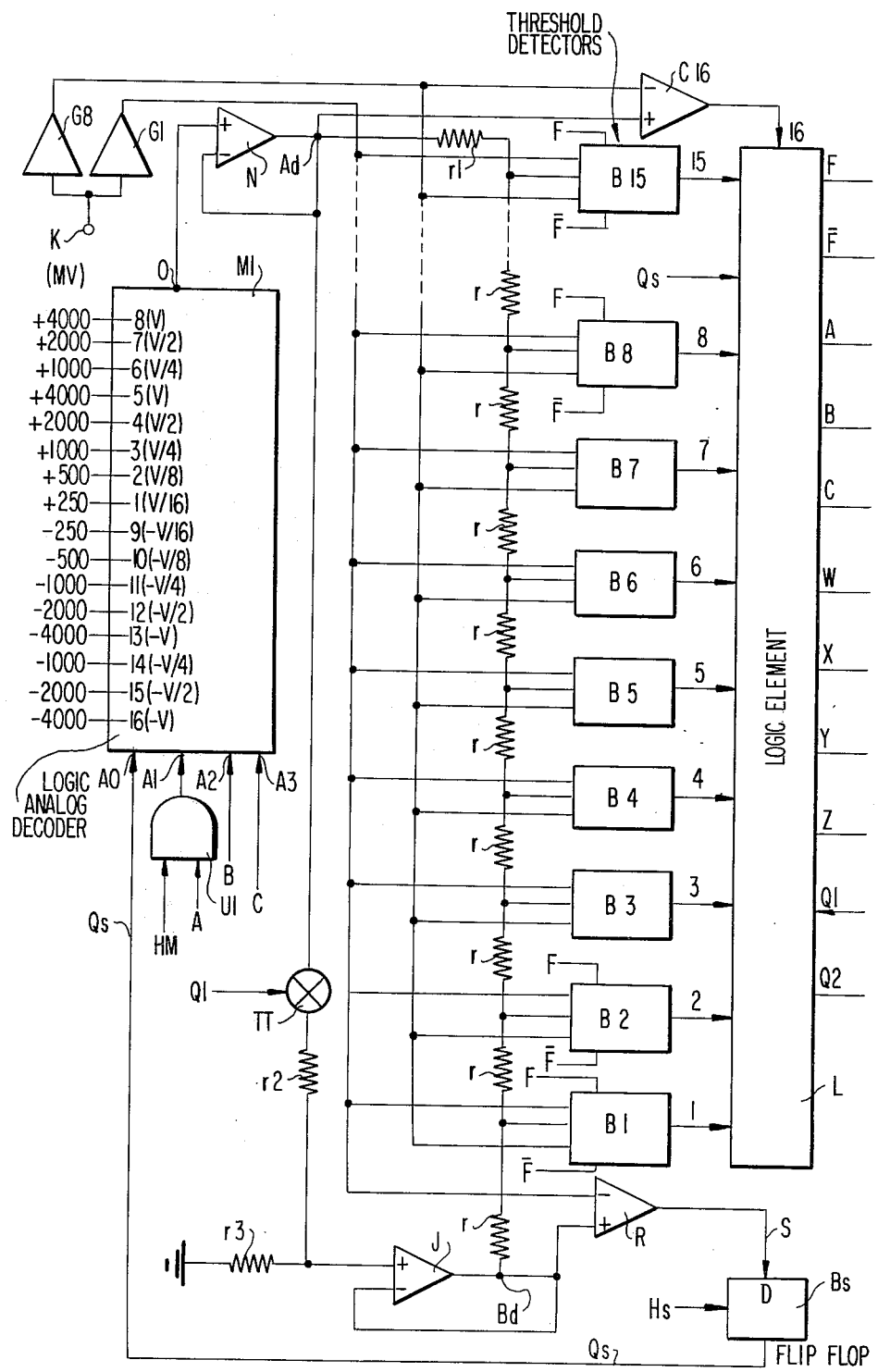
FIGS. 6 and 7 are, respectively, a simplified general diagram and a diagram of a sub-assembly forming a part of FIG. 6, comprising modifications which are to be made to FIGS. 1 and 3 to obtain operation according to the diagram of time periods in FIG. 5.

FIG. 6 — In the diagram according to FIG. 6, which corresponds to FIG. 1, a comparator C 16 whose + input is connected to the point Ad and whose − input is connected to the output of the amplifier G8 is added. Its output marked 16 is applied to the logic element L.

Figure 7:
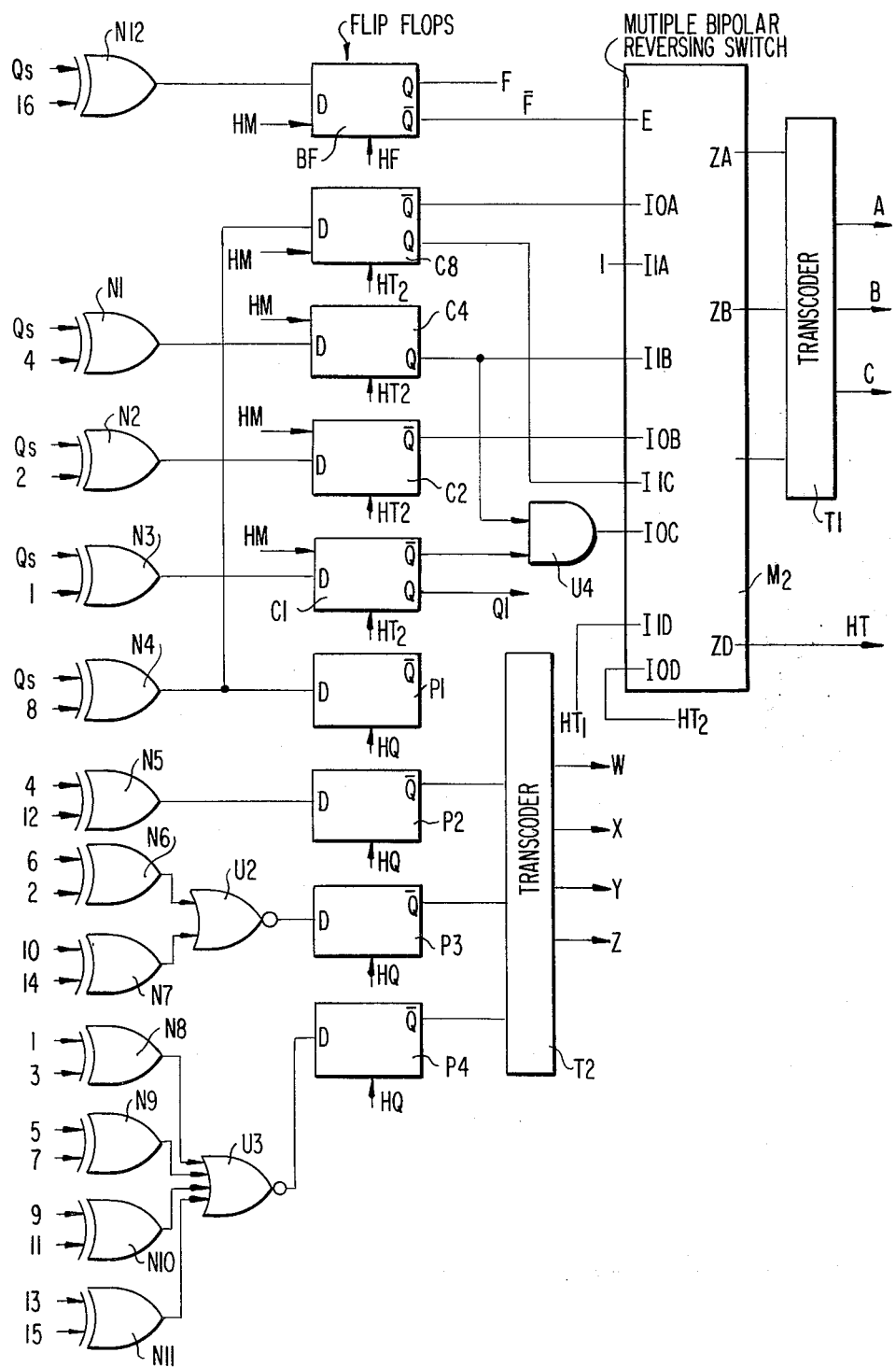

FIG. 7 — In the diagram according to FIG. 7, which corresponds to FIG. 3, the output "16" is applied, at the same time as the signal QS (output signal of the flip-flop BS, see FIG. 2), to the input of an EXCLUSIVE OR circuit N12, whose output is connected to the terminal D of the flip-flop BF.

The multiplexer M2 is of the quadruple type: besides the outputs ZA, ZB, ZC, it has an output ZD, to which correspond two inputs 11D, 10D, which receive respectively the clock signals $HT_1$ and $HT_2$; the result of this is that the clock signals HT applied to the flip-flops C1, C2, C4, C8 are either $HT_1$ or $HT_2$, according to the position of the multiplexer M2, given by the valency of the signal $\bar{F}$, applied by the flip-flop BF to the input E of the multiplexer M2.

In application of the basic principle laid down hereinabove, the device may receive numerous modifications without going beyond the scope of the invention. More particularly, according to a variant which affords an advantage, the two amplifiers G1, G8 in FIG. 1 and 6, having a gain of 1 and 8 respectively, may be replaced by a single amplifier which may assume a gain of either 1 or 8. Such a variation in gain is obtained in a manner known per se by a switching of resistors in a negative reaction network connected with the single amplifier. Switching is provided by analog gates which are themselves controlled by a double threshold detector which receives the analog level to be coded at the same time as the single variable gain amplifier.

That technological modification is an advantage due to the fact that it enables the fifteen double comparators (B1...B15) to be replaced by fifteen single comparators: it therefore affords a great economy in components.

While We have shown and described one embodiment in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim is:

1. A series-parallel coder subject to a compression law having several segments with different slopes, capable of providing, for a positive or negative sample, a first code defining the number of the segment, then a second code defining the position on the said segment, comprising a voltage divider having a voltage high point and voltage low point, a single set of threshold detectors, each of said threshold detectors formed of two amplifier-comparators connected in an arithmetical progression between said voltage high point and said voltage low point of said voltage divider, logic means receiving the outputs of said threshold detectors for selectively setting the potential of the voltage low point of said voltage divider either at zero potential or at a potential which is half the voltage high point of said voltage divider and for applying to the voltage high point of the voltage divider a selected potentital $V/2^n$, where V is a reference voltage and n may vary from O to k according to the order K of the segment, and amplifier means including two amplifiers for applying a segment signal to each of said threshold detectors in parallel, one of said two amplifiers having a gain of 1 and having an output connected to a negative input of one of said two amplifier-comparators, and the other of said two amplifiers having a gain of 8 and having an output connected to a negative input of the other of said two amplifier-comparators, wherein said two amplifiers receive as a common input the level to be coded.

2. A coder according to claim 1, wherein said logic means includes a first logic section for determining the order of the segment, said first logic section including a plurality of first flip-flops, a first flip-flop of said plurality providing respective output signals for operating said threshold comparators.

3. A coder according to claim 2, characterized in that said logic means further includes a second logic section which comprises an analog gate for selectively connecting said voltage high point to said voltage low point via an additional voltage divider connected to ground.

4. A coder according to claim 3, wherein said second logic section further includes an analog decoder receiving positive or negative voltages spaced out in geometrical progression and logic inputs receiving segment bits from said first logic section for applying to the said voltage high point said selected potential.

5. A series-parallel coder subject to a compression law having several segments with different slops, capable of providing, for a sample, a first code defining the number of the segment, than a second code defining the position on the said segment, comprising, a voltage divider having a voltage high point and voltage low point, a single set of threshold detectors formed of comparators connected in an arithmetical progression between said voltage high point and said voltage low point of said voltage divider, logic means receiving the outputs of said threshold detectors for selectively setting the potential of the voltage low point of said voltage divider either at zero potential or at a potential which is half the voltage high point of said voltage divider and for applying to the voltage high point of the voltage divider a selected potential $V/2^n$, where V is a reference voltage and n may vary from O to k according to the order K of the segment, wherein said logic means includes a first logic section for determining the order of the segment, said first logic section being formed by a plurality of EXCLUSIVE OR gates applying to a plurality of first flip-flops exclusively the output signals of selective ones of said threshold comparators in geometrical progression, and amplifier means applying a segment signal to each of said threshold detectors in parallel, characterized in that each threshold comparator is formed by two amplifier-comparators having their outputs connected to a common point, each amplifier-comparator having a positive input and a negative input, the two positive inputs of each pair being connected in common to a selected point of said voltage divider formed by a chain of resistors of equal value and the negative input of one amplifiercomparator being connected to the output of an amplifier of said amplifier means having a gain of 1, the negative input of the other amplifier-comparator being connected to the output of a second amplifier of said amplifier means having a gain of 8, the two amplifiers of said amplifier means receiving as a common input the level to be coded, said amplifier-comparators being operated by the respective outputs of a first flip-flop of said first logic section of said logic means.

6. A coder according to claim 5, wherein said first logic section of said logic means includes first means for starting up the amplifier having a gain of 1 at the beginning of a coding cycle, then to maintain the said amplifier having a gain of 1 if the level to be coded exceeds a predetermined value, or to start up the amplifier having a gain of 8 if the level to be coded is less than the said predetermined value.

7. A coder according to claim 5, wherein said first logic section of said logic means includes second means for starting up the amplifier having a gain of 8 at the beginning of a coding cycle and for starting up the amplifier having a gain of 1 according to the response of a comparator which receives, on an input, the output of the amplifier having a gain of 1, and, on another input, a reference voltage.

8. A coder according to claim 7, wherein said first logic section of said logic means includes third means for determining the number of the segment in a time $HT_1$ which coincides with a clock time HF, if the input level is on a segment having a low weight or in a subsequent period $HT_2$ if the input level is on a segment having a high weight.

* * * * *